United States Patent [19]

Schuller et al.

[11] 4,448,854

[45] May 15, 1984

[54] COHERENT MULTILAYER CRYSTALS AND METHOD OF MAKING

[75] Inventors: Ivan K. Schuller, Woodridge, Ill.; Charles M. Falco, Tucson, Ariz.

[73] Assignee: The United States of America as represented by the Department of Energy, Washington, D.C.

[21] Appl. No.: 441,900

[22] Filed: Nov. 15, 1982

Related U.S. Application Data

[63] Continuation-in-part of Ser. No. 202,083, Oct. 30, 1980, abandoned.

[51] Int. Cl.$^3$ .................... B32B 15/04; B32B 15/20
[52] U.S. Cl. ........................... 428/611; 428/635; 428/660; 428/662; 428/663; 428/665; 428/673; 428/674; 428/680; 428/926
[58] Field of Search ........ 428/611, 635, 620, 660–667, 428/673, 674, 678, 680, 607, 926, 606

[56] References Cited

U.S. PATENT DOCUMENTS

| | | | |
|---|---|---|---|
| 3,370,980 | 2/1968 | Anderson | 117/227 |
| 3,382,099 | 5/1968 | Montmory | 117/215 |
| 3,417,301 | 12/1968 | Galli et al. | 317/237 |
| 4,088,515 | 4/1975 | Blakeslee et al. | 148/175 |
| 4,268,584 | 5/1981 | Ahn et al. | 428/620 |

OTHER PUBLICATIONS

Blakeslee, A. E., "Vapor Growth of a Semiconductor Super Kittice", *J. Electrochem Soc.*, pp. 1459–1463, vol. 118 (9/71).
Matthews, J. W., et al., "Defects in Epitaxial Multilayers," *J. of Crystal Growth*, vol. 27, pp. 118–125 (1974).
Matthews, J. W., et al., "Defects in Expitaxial Multilayers", *J. of Crystal Growth*, vol. 32, pp. 265–273 (1976).
Reinhart, F. K., et al., "Interface Stress of $Al_x$-$Ga_{1-a}As$-Ga As Layer Structures" *J. App. Physics* vol. 44, p. 3171 (1973).
Panish, M. B., "Molecular Beam Epitaxy" *Science* vol. 208. pp. 916, 919 (5/80).
Segmüller, A., et al., "X-Ray Diffraction Study of a One-Dimensional GaAs-AlAs Superlattice", *J. Appl. Cryst.* pp. 1,2 vol. 10 (1977).
Schuller, I. K., et al., "Layered Ultrathin Coherent Structures", UAC-42719, Argonne National Laboratory, 2 pp. unnumbered (11-1-79).
Schuller, I. K., et al., "Layered Ultrathin Coherent Structures", UAC 43082, Argonne National Laboratory, 6 pp. unnumbered (11-1-79).
Schuller, I. K., et al., "Layered Ultrathin Coherent Structures", *Inhomogeneous Superconductors*–1979, Am. Inst. Physics, pp. 197–202 (1980).
Schuller, I. K., "New Class of Layered Materials", *Amer. Phys. Soc.* vol. 44 No. 24, pp. 1597–1600 (6/80).
Zherg, J. Q., et al., "Superconducting and Transport Properties of NbT: Layered Metals", *Physica B* pp. 945–946 (11/11/1981).
Meyer, K. et al., "Thermalization of Sputtered Atoms", *J. Appl. Phys.* vol. 52, No. 9, p. 5803 (9/81).
Zherg, Z. et al., "Magnetization of Compositionally Modulated CuNi Films", *App. Phys. Lett.* vol. 38, No. 6, pp. 424–426 (3/81).
Meyer, K. E., et al., "Models of Diffraction from Layered Ultrathin Coherent Structures" *J. Appl. Phys.* vol. 52, No. 1, pp. 6608–6610 (11/81).

*Primary Examiner*—Michael L. Lewis
*Attorney, Agent, or Firm*—Jeannette M. Walder; James W. Weinberger; Michael F. Esposito

[57] ABSTRACT

A new material consisting of a multilayer crystalline structure which is coherent perpendicular to the layers and where each layer is composed of a single crystalline element. The individual layers may vary from 2Å to 100Å or more in thickness.

9 Claims, 12 Drawing Figures

COHERENT MULTILAYER CRYSTALS AND METHOD OF MAKING

CONTRACTUAL ORIGIN OF THE INVENTION

The U.S. Government has rights in this invention pursuant to Contract No. W-31-109-ENG-38 between the U.S. Department of Energy and Argonne National Laboratory.

CROSS-REFERENCE TO RELATED APPLICATION

This application is a continuation-in-part of our copending application Ser. No. 202,083, filed Oct. 30, 1980, now abandoned.

BACKGROUND OF THE INVENTION

This invention relates to a new material. More specifically, this invention relates to a new multilayer crystalline structure which is coherent perpendicular to the layers and in which the layers are ultrathin alternating layers of crystalline materials which are not semiconductor compounds. The invention also relates to a method of making this new multilayer crystalline material.

Crystalline, coherent, multilayered structures having very thin component layers that differ in composition but which are lattice-matched, generally known as superlattices, form the basis for a number of different semiconductor devices. The semiconductor superlattices have been used to prepare solid state lasers and as optical modulators, optical switches, waveguides and couplers.

It has been universally accepted that these structures can only be produced without defects if the constituents have the same crystal structure and closely matching lattice parameters. The defects or dislocations result when the lattice parameters differ too greatly, imposing an elastic strain upon the lattice. In addition, if the components are not properly matched, diffusion will occur between layers which will destroy the superlattice structure.

Heretofore, these superlattice structures have only been prepared of alternating layers of lattice-matched compounds which have generally been semiconductors. The constitutents are usually binary compounds of one of the group IIIA elements Al, Ga and In and one of the Group V elements P, As and Sb. The superlattices are then formed by layering, for instance GaAs and AlAs. These have the same crystal structures and only a small variation in lattice spacing. These semiconductor superlattice structures may be formed by a number of different techniques. For example, a superlattice structure is produced by epitaxially growing a semiconductor material such as GaAs, which is periodically doped so as to produce alternating ultrathin layers having different conductivity types. More recent methods for the preparation of semiconductor superlattices include vapor phase and liquid phase epitaxy. Molecular beam epitaxy has become particularly successful because it provides the ultra high vacuum and high purity conditions believed necessary to produce high quality superlattice material. However, none of these methods have been successful in producing multilayered crystals from materials which are not lattice-matched.

SUMMARY OF THE INVENTION

It has been found that it is possible to prepare an artificial superlattice structure where the constituents have different crystal structure and large differences in their lattice parameters by sputter deposition under carefully controlled conditions. The new material has a multilayer crystalline structure which is coherent perpendicular to the layers, the layers consisting of a plurality of parallel ultrathin alternating layers of two different elements, each layer being a single crystalline element from 2 Å to 100 Å or more in thickness. The crystal is composed of two elements which may have non-matching lattice structure, and will grow epitaxially on each other without intermixing.

The multilayered structure of the invention is preferably prepared by sputter depositing alternate layers of material onto an appropriate substrate under conditions which promote epitaxial or crystalline growth. Epitaxial growth has been found to occur when the thermal energy of the sputtered atoms has been slowed to about the temperature of the substrate. This is accomplished by controlling both the distance from the source to the substrate and the pressure of the sputtering gas.

The process of the invention for preparing multilayer crystals of two or more elements consists of placing a suitable substrate crystal into a vacuum vessel which contains a sputtering gun for forming a beam of atoms for each element in the crystal, the substrate being at least 10 cm from the sources of the beams. The ambient gas is removed from the vessel and a pressure of sputtering gas is established. The substrate is then heated to from 150° to 450° C. and a beam of sputtered atoms is established from each sputtering gun. The pressure of the sputtering gas in the chamber and the distance of the source of the beams to the substrate is then adjusted to reduce the temperature of the atoms as they reach the substrate to about the temperature of the substrate, so that the atoms as they contact the substrate will form a crystalline structure and will not displace or eject the atoms in the lower layers. The substrate is then passed alternately over each beam of sputtered atoms to deposit a plurality of parallel ultrathin alternating layers of two crystalline materials on the substrate and form a multilayer crystal, which is coherent perpendicular to the layers.

Multilayer crystals may be prepared from a number of different elements and combination of elements by this method and many are expected to exhibit interesting and useful properties. For example, multilayer crystals of alternating layers of copper and niobium and of titanium and niobium have been found to exhibit superconducting properties in which the $T_c$ of the material has been found to be dependent upon the thickness of the layers.

It is therefore one object of the invention to provide a new material which is a multilayer crystal comprised of at least two elements which are not semiconducting compounds.

It is another object of the invention to provide a new material which is a multilayer crystal having a superlattice structure which is coherent perpendicular to the layers and in which the ultrathin alternating layers of different elements are not semiconducting compounds and where the layers may be as thin as 2 Å.

It is still another object of the invention to provide a coherent multilayer crystal having superconducting properties.

It is still another object of the invention to provide a method for preparing a multilayer crystalline structure which is coherent perpendicular to the layers from two or more elements which have dissimilar crystal structure and lattice parameters.

Finally, it is the object of the invention to provide a method for preparing a coherent multilayer crystal from two or more elements having dissimilar crystal structure and lattice parameters by sputter disposition.

DETAILED DESCRIPTION OF THE PREFERRED EMBODIMENT

Figure 1:
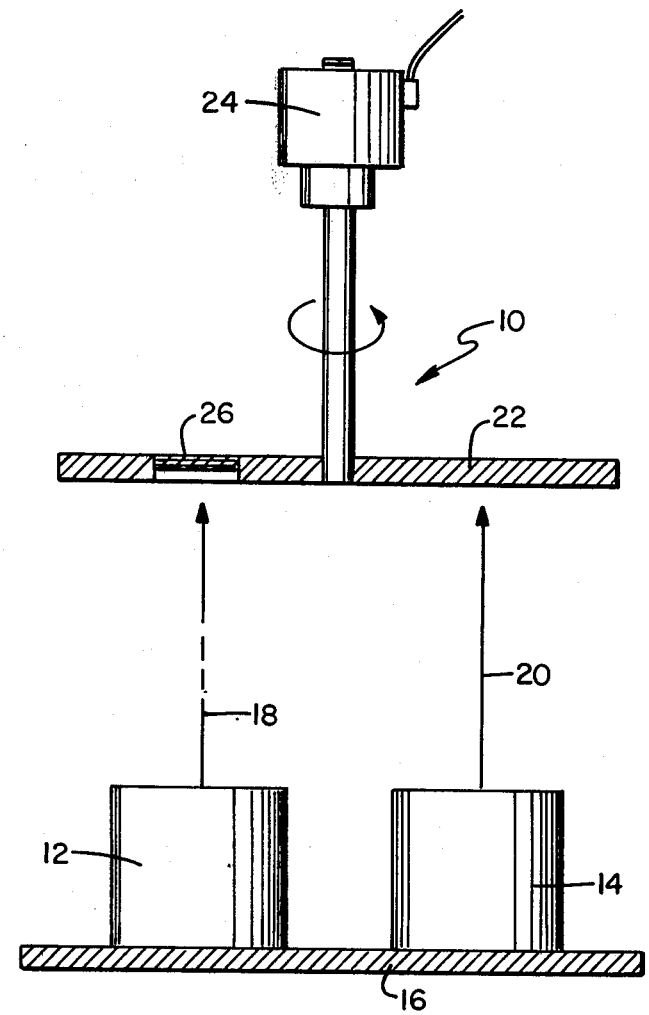
FIG. 1 is a drawing of the sputtering device used to prepared the multilayer crystals of the invention.

These and other objects of the invention for preparing multilayer crystals from two different elements may be met by selecting an appropriate substrate crystal, such as sapphire, which is placed into a vacuum chamber containing a sputtering gun for forming a beam of atoms for each element in the crystal, the gun being capable at sputtering of a rate between 10 and 100 Å per second. The elements may be any pair of elements from the group of niobium and copper, niobium and nickel, niobium and titanium, nickel and molybdenum, nickel and tungsten and nickel and silver. The substrate is positioned about 15" from the source of the beams. The vessel is sealed and the ambient gas pumped from the vessel before a argon sputtering gas pressure of at least $1 \times 10^{-2}$ Torr is established. The substrate is heated to about 200° C. and a beam of sputtered atoms is established from each sputtering gun. The sputtering gas pressure and the distance from the source of the beams of atoms to the substrate must be sufficient to reduce the temperature of the atoms in the beam as they reach the substrate to about the same temperature as the substrate so that as the atoms contact the substrate they have sufficient energy to form a crystalline structure but not enough energy to displace or eject atoms in the crystal or in layers already formed. The multilayer crystal is formed by alternately passing each beam of sputtered atoms over the substrate to deposit a plurality of ultra-thin, discrete, alternate layers of two crystalline materials on the substrate and form a plurality of single crystals perpendicular to the layers thereby forming the multilayer coherent crystal. The crystal may contain from about 100 to an infinite number of layers.

The material of the invention may be prepared from any combination of elements which will not intermix with each other under the deposition conditions and which will grow epitaxially on each other to form discrete layers. Preferably, the elements have different lattice structures. Pairs of elements known to form the ultrathin layered coherent structures include niobium and copper, niobium and nickel, nickel and silver, niobium and titanium, nickel and molybdenum and nickel and tungsten. Of these pairs, nickel and silver, which have a similar lattice structure, form layers in which the two elements are not crystalline, while the other pairs, which differ in lattice structure, have been shown to form with no intermixing between the crystalline layers and form the perpendicular single crystal structure. The layered structure is not limited to only two different elements but may consist of any number of different elements which meet the criteria for epitaxial growth and non-intermixing.

The epitaxial growth characteristics of many of the various elements relative to each other and appropriate substrates can be determined by reference to Epitaxial Growth, Part B, Materials Science Service, edited by J. W. Matthews, Academic Press, New York, 1975.

The substrate may be any substance upon which the particular material to be deposited is known to grow epitaxially such as sapphire or mica. Other appropriate substrates can be determined by reference to the hereinbefore cited publication.

Substrate deposition temperatures will vary according to the material to be deposited and upon the substrate to be used, but may generally vary from about 150° to 450° C. Temperatures for other materials can readily be determined by one skilled in the art.

Preferably, the layered superlattice structure is prepared by sputter deposition. Referring now to FIG. 1, the sputtering apparatus 10 is enclosed in a vacuum vessel (not shown) and consists of a pair of sputtering guns 12 and 14 spaced 10 inches apart and mounted on base 16 so that their respective beams 18 and 20 are parallel. Adjustably mounted about 15" above guns 12 and 14, perpendicular to the beams is a table 22 rotated by a motor 24 having a controlled rotational speed. A suitable substrate 26 is mounted on table 22 so that is passes sequentially through beams 18 and 20. The substrate may be heated by a quartz lamp (not shown). In this manner, deposits from each sputtering gun are sequentially layered upon the substrate. The sputtering is performed under a partial pressure of inert gas and sputtering rates are controlled by keeping the sputtering pressure and power constant. The layers may range in thicknes from one atomic layer (about 2 Å) to as thick as desired but generally no more than 2500 Å. Preferably the layers will vary from 2 to about 100 Å in order for the crystal to exhibit useful properties. The thickness at the individual layers is controlled by varying the rotational speed of table 22 which determines the length of time the substrate is in the path of each beam.

While the sputtering device may be of any of the well known types, it is preferred that they be capable of a high rate of sputtering, on the order of 10 to 100 Å per second. Sputtering is generally done at rates varying from 10 to 60 Å per second, preferably 50 Å per second. This enables the layers to be deposited rapidly while reducing the possibility of contamination from foreign elements in the gas such as oxygen which could affect the properties of the layered structure. One sputtering apparatus found to have a suitable rate of deposition is a dc magnetron although other types of apparatus such as rf sputtering may also be satisfactory.

The sputtering gas is any high purity inert gas suitable for sputtering, such as argon. The pressure of the gas in the vacuum vessel is important and is preferably at least $1 \times 10^{-2}$ Torr and may range as high as $20 \times 10^{-3}$ Torr as will be explained hereinafter.

It is important for the successful preparation of coherent multilayer crystals of elements having dissimilar lattice structures and parameters by sputter deposition, that the speed of the atoms in the sputtered beam be slowed down before they reach the substrate, so that as the atoms contact the substrate they have sufficient energy to form a crystalline structure but are not so energetic as to cause the displacement or ejection of any atoms in the substrate or in one of the layers already formed. It has been determined that this energy is equivalent to the temperature of the substrate. This slowing down of the sputtered atoms is accomplished by adjusting the distance between the source of the beam of sputtered atoms and the substrate so that the sputtered atoms have enough collisions, generally believed to be larger than 8 to 10 so that the thermal velocity of the atoms is about equal to the thermal velocity of the sputtering gas which is in turn about equal to the temperature of the substrate. Thus be increasing the gas pressure, more atoms of gas are available for collisions, while increasing the distance from source to substrate also increases the chance for collisions and thus thermalization of the sputtered atoms. Thus the source to substrate distances may vary from about 10 to 50 cm. For the multilayer crystal structures which have been prepared thus far, distances of about 38 cm (15 inches) at gas pressures of about 4 to $6 \times 10^{-3}$ Torr have been found to be satisfactory.

The following Examples are given only to illustrate the invention and are not to be taken as limiting the scope of the invention which is defined by the appended claims.

EXAMPLE I

A crystalline material consisting of alternating layers of niobium and copper and which was coherent perpendicular to the layers was prepared by sputter deposition using the apparatus previously described containing two high rate (~50 Å sec) dc magnetron sputtering guns. The sputtering chamber was initially pumped to $5.2 \times 10^{-7}$ Torr and after argon was admitted was maintained at about $5.7 \times 10^{-3}$ Torr. A sapphire substrate mounted on the rotating table was heated to about 200° C. and was passed through the beams at 13.6 rpm. The Cu target power was 930 watts and the Nb target power was 1.8 kW. A total sputtering time of 13 minutes, 37 seconds produced a structure having a total thickness of 1.1 micrometers with an individual layer thickness of 28 Å.

EXAMPLE II

Figure 2:
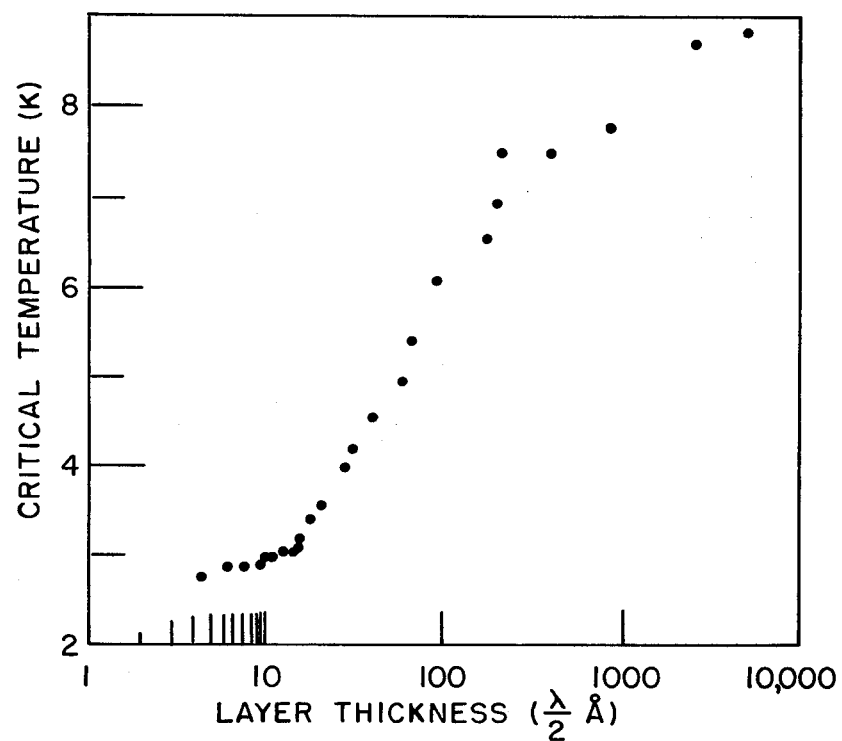
FIG. 2 is a curve showing the relationship between $T_c$ and layer thickness for multilayer crystals of niobium and copper.

To characterize the material, Ion Mill Auger Spectroscopy was performed on a sample prepared in a manner similar to that of Example I. To depth profile the chemical composition of the sample, it was bombarded with 1 keV Xe ions. This slowly mills the surface of the films, while simultaneously the Auger spectrum is analyzed. The spectrum, shown in FIG. 2, displays a regular oscillation in Cu concentration verses depth indicating the presence of regular copper layers.

EXAMPLE III

A niobium-nickel structure was prepared by sputter deposition onto a sapphire substrate at 200° C. as described hereinbefore. The argon pressure was $8.6 \times 10^{-3}$ Torr while the target power was 1.5 and 1.7 kW for the nickel and niobium targets respectively. At a rotational speed of 8 rpm and a total deposition time of 17 minutes, 13 seconds, the total structure thickness was 6100 Å with the layers 30 Å thick each. X-ray diffraction studies confirmed that the different layers were each 30 Å in thickness.

EXAMPLE IV

Figure 3:
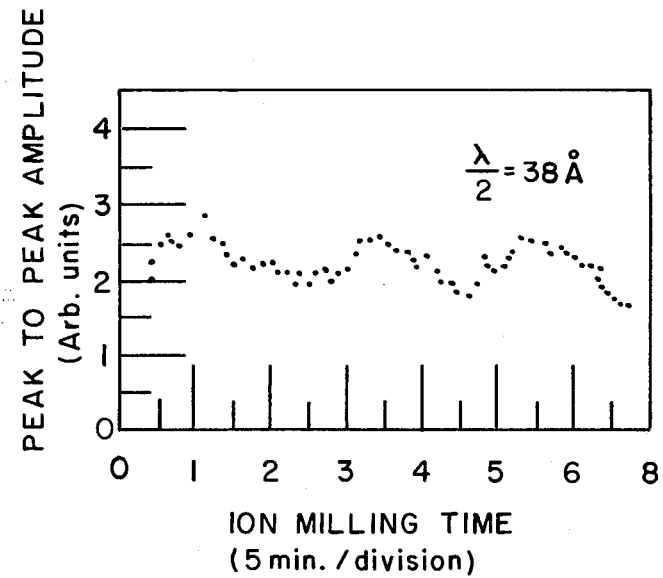
FIG. 3 is a graph of the depth profile of the copper concentration for a niobium-copper multilayer crystal in which each layer is about 38 Å thick.

A number of layered niobium-copper crystals were tested for superconductivity using a standard test. The results, shown in FIG. 3, display the unusual dependence of the superconducting transition temperature on the layer thickness. This indicates that the transition temperature of the material can be tuned by carefully controlling the layer thickness.

EXAMPLE V

A multilayer crystal of niobium-titanium was prepared by sputter deposition on a sapphire substrate as described before. The substrate to atom source distance was 15 inches and the substrate temperature was held at about 200° C. The sputtering gas pressure was $6 \times 10^{-3}$ Torr. The power of the gun containing the titanium target was 1.3 kW to provide a sputtering rate of 20 Å per sec while the power of the gun containing the niobium target was 1.25 kW to attain a similar ratio. The substrate was rotated at 30 rpm for 40 minutes to prepare a crystalline structure 2 micrometers in total thickness. The thickness of each layer was estimated to be 10 Å which was confirmed by x-ray diffraction.

EXAMPLE VI

Figure 4A:
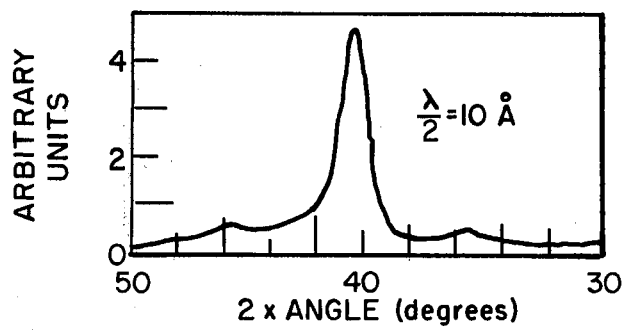
FIG. 4 is a series of graphs showing the x-ray diffraction curves for several niobium-copper multilayer crystals having increasing layer thickness.
Figure 4B:
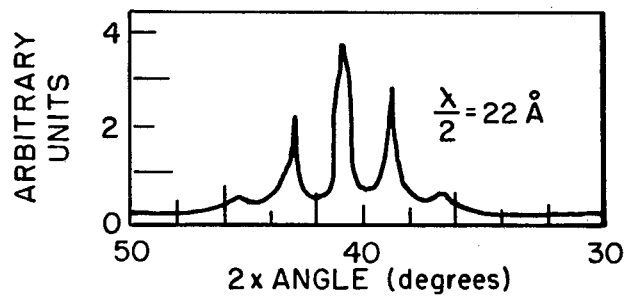
Figure 4C:
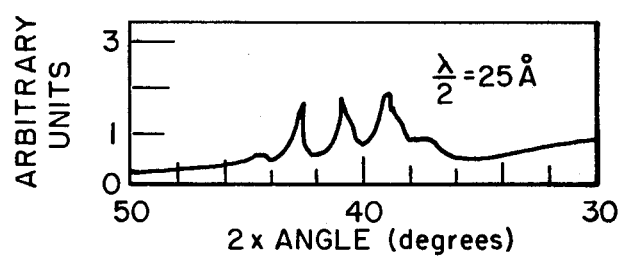
Figure 4D:
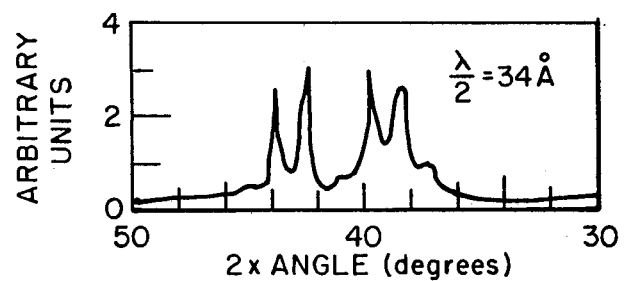
Figure 4E:
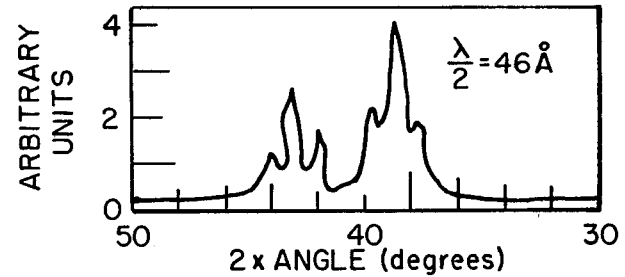

A number of samples of niobium-copper superlattice materials having different layer thicknesses in the range of 10 to 100 Å were studied using ordinary x-ray diffraction techniques. The sample and the detector were rotated synchronously so as to keep the source-sample angle equal to the sample-detector angle. In this fashion the measurement is only sensitive to changes in scattering function and strains perpendicular to the x-y plane of the film and layers. Shown in FIGS. 4a through 4c are the results for materials having increasing layer thickness. FIG. 4a shows one central peak located midway between the pure Nb and Cu peaks and two additional satellite peaks symmetrically spaced around the central peak. It can readily be seen from FIG. 4 that there is a continuous consistent way in which the x-rays evolve from the small wave length limit to the large one. This consistent evolution can be directly related to the presence of the superlattice. Up to eleven distinct peaks were observed and x-ray line widths were within fractions of two of the diffractometer resolutions. Samples that had been aged for more than six months did not shown any noticeable change in their diffraction properties.

EXAMPLE VII

A multiple crystal of nickel-tungsten was prepared by sputter deposition on a saphire substrate as described before. The substrate to atom source distance was about 15 inches and the substrate temperature was held at about 200° C. The sputtering gas (argon) pressure was $1.0 \times 10^{-2}$ Torr. The power of the gun containing the tungsten was 1.3 kW while the power of the gun containing the nickel target was 2.5 kW. The substrate was rotated at 7 rpm for 36 minutes to prepare a crystalline structure 1.5μ in total thickness. The thickness of each layer was estimated from rotation speed to be 30 Å which was confirmed by x-ray diffraction.

EXAMPLE VIII

A nickel-molybdenum structure was prepared by sputter deposition onto a mica substrate at 200° C. The argon pressure was $1.6 \times 10^{-2}$ Torr, and the target power was 2.2 kW for the nickel and 1.3 kW for the molybdenum to provide a sputtering rate of 30 Å second. At a rotational speed of 3.5 rpm and a total deposition time of about 25 minutes, total structure thickness was about 1.2μ. Layer thickness of about 65 Å, estimated from sputtering rate and rotation speed, was confirmed by x-ray diffraction studies. The studies also confirmed the discreteness or lack of intermixing between the various layers, and confirmed the formation of the coherent superlattice structure.

EXAMPLE IX

Figure 5A:
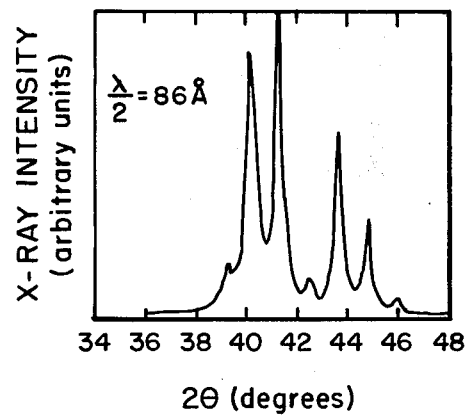
FIG. 5 is a series of graphs showing the x-ray diffraction curves for several molybdenum-nickel multilayer crystals having different layer thicknesses.
Figure 5B:
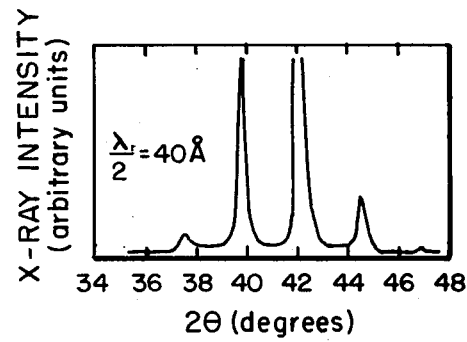
Figure 5C:
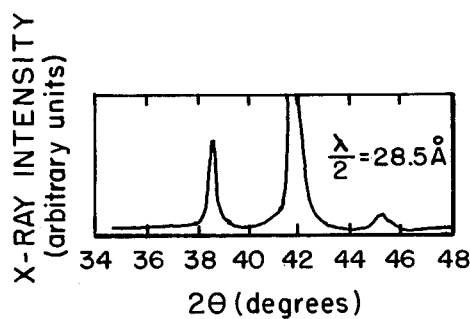
Figure 5D:
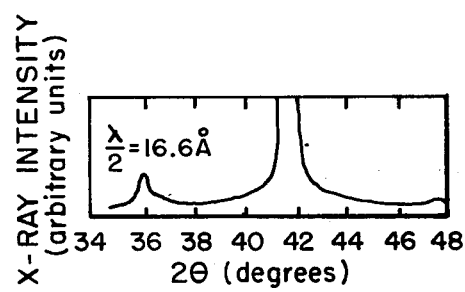

A number of samples of nickel-molybdenum superlattice crystals each having layer thickness ranging from 16.6 Å to 86 Å were subjected to x-ray diffraction studies, using the method described in Example VI. Shown in FIGS. 5a through 5c are the results for materials having decreasing layer thickness. The even pattern of the peak is directly related to the presence of the periodic alternating structure of the superlattice crystal and confirms that each layer is discrete, that single crystals have formed perpendicular to the layers and that there is no intermixing of atoms between the layers of crystalline material.

Thus it can be seen from the preceding discussion and Examples that the invention provides a new superlattice crystal of elements not known previously to be amenable to the formation of the coherent multilayer crystalline structure and to a method for preparing such structure.

The embodiments of this invention in which an exclusive property or privilege is claimed are defined as follows:

1. A new material comprising a multilayered crystalline structure which is coherent perpendicular to the layers, the structure consisting of a plurality of parallel, ultrathin, alternating, crystalline, epitaxial layers of two different elements, each layer being a single element having a thickness of about 2 to 100 Å.

2. The material of claim 1 wherein the two different elements are pairs selected from the group of niobium and copper, niobium and nickel, niobium and titanium, nickel and molybdenum, nickel and tungsten, and nickel and silver.

3. The material of claim 1 wherein the two different elements have non-matching lattice structures.

4. The material of claim 3 wherein the two different elements are pairs selected from the group of niobium and copper, niobium and nickel, niobium and titanium, nickel and molybdenum, and nickel and tungsten.

5. The material of claim 4 wherein the multilayer crystal is composed of copper and niobium.

6. The material of claim 4 wherein the multilayer is composed of niobium and nickel.

7. The material of claim 4 wherein the multilayer is composed of niobium and titanium.

8. The material of claim 4 wherein the multilayer is composed of nickel and molybdenum.

9. The material of claim 4 wherein the multilayer is composed of nickel and tungsten.

* * * * *